(12) United States Patent
Verma et al.

(10) Patent No.: US 7,414,432 B2
(45) Date of Patent: Aug. 19, 2008

(54) DEDICATED LOGIC CELLS EMPLOYING SEQUENTIAL LOGIC AND CONTROL LOGIC FUNCTIONS

(75) Inventors: Hare K. Verma, Cupertino, CA (US); Ravi Sunkavalli, Milpitas, CA (US); Manoj Gunwani, San Jose, CA (US); Chandra Mulpuri, San Jose, CA (US)

(73) Assignee: Cswitch Corporation, Santa Clara, CA (US)

( * ) Notice: Subject to any disclaimer, the term of this patent is extended or adjusted under 35 U.S.C. 154(b) by 0 days.

(21) Appl. No.: 11/539,825

(22) Filed: Oct. 9, 2006

(65) Prior Publication Data
US 2007/0075741 A1    Apr. 5, 2007

Related U.S. Application Data

(62) Division of application No. 11/065,019, filed on Feb. 23, 2005, now Pat. No. 7,368,941.

(51) Int. Cl.
*H03K 19/177* (2006.01)
(52) U.S. Cl. .......................... 326/41; 326/47
(58) Field of Classification Search ............. 326/37–41, 326/47
See application file for complete search history.

(56) References Cited
U.S. PATENT DOCUMENTS
6,288,570 B1 * 9/2001 New .................... 326/41
6,384,627 B1 * 5/2002 Fross et al. .................... 326/39

* cited by examiner

*Primary Examiner*—James H Cho
(74) *Attorney, Agent, or Firm*—Peter Su

(57) ABSTRACT

A dedicated logic cell in a programmable logic structure is described that comprises the following primary components: a configurable logic function or look-up table (LL), a dedicated logic function (DL), a sequential logic function (LS), and a control logic function (LC). In this illustration, the dedicated logic cell comprises two configurable logic function, two sequential logic functions, a dedicate logic function, and a control logic function. In a first embodiment, the dedicated logic cell is constructed with a combination of configurable logic functions that are coupled to a dedicated logic function in order to perform a four 2-input function, an AND function, an OR function, or an XOR function. In a second embodiment, the dedicated logic cell is constructed with a combination of configurable logic functions that are coupled to a dedicated logic function in order to perform a four 2-to-1 multiplexer function. In a third embodiment, the dedicated logic cell is constructed with a plurality of configurable logic functions that operate as a two 6-input function with separate inputs. In a fourth embodiment, the dedicated logic cell is constructed with a combination of a configurable logic function with sequential logic functions that operate as a loadable, resettable, clearable shift register. In a fifth embodiment, the dedicated logic cell is constructed with a combination of configurable logic functions, a dedicated logic function, and a sequential logic functions that operate as an accumulator.

17 Claims, 18 Drawing Sheets

1000 Priority multiplexer 1300 4 2-input function 1600 loadable/resettable/clearable shift register

DEDICATED LOGIC CELLS EMPLOYING SEQUENTIAL LOGIC AND CONTROL LOGIC FUNCTIONS

This application is a division of U.S. application Ser. No. 11/065,019, filed 23 Feb. 2005, now U.S. Pat. No. 7,368,941 by inventors Hare K. Verma, Ravi Sunkavalli, Manoj Gunwani and Chandra Mulpuri, entitled "Dedicated Logic Cells Employing Sequential Logic and Control Logic Functions."

This application relates to a concurrently filed U.S. patent application Ser. No. 11/066,336 filed 23 Feb. 2005, now U.S. Pat. No. 7,358,765, entitled "Dedicated Logic Cells Employing Configurable Logic and Dedicated Logic Functions" by Verma et al., owned by the assignee of this application and incorporated herein by reference.

This application relates to a co-pending U.S. patent application Ser. No. 10/654,517, entitled "Programmable Function Generator and Method Operating as Combinational, Sequential, and Routing Cells" by Hare K. Verma and Ashok Vittal, filed on Sep. 2, 2003, owned by the assignee of this application and incorporated herein by reference.

This application relates to a co-pending U.S. patent application Ser. No. 10/319,720, entitled "Programmable Integrated Circuit Architecture" by Ashok Vittal and Hare K. Verma, filed on Dec. 13, 2002, owned by the assignee of this application and incorporated herein by reference.

BACKGROUND OF THE INVENTION

1. Field of Invention

The present invention relates generally to integrated circuits (ICs) such as field programmable gate arrays (FPGAs), and more particularly to structures and functionalities in a dedicated logic circuit in the field programmable gate arrays.

2. Description of Related Art

Field programmable gate arrays are often selected by design engineers to provide a flexible approach in programming and re-programming integrated circuits in order to accommodate a system specification, correct errors in the system, or make improvements to the system by reprogramming the FPCA. One conventional field programmable gate array architecture is implemented by using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switchbox. The look-up table outputs are directly fed to other look-up tables as well as the elements within the look-up tables, but the connections to other look-up tables' inputs are made through the switchbox.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box.

A key building block in a programmable logic circuit is the design of a configurable logic block. It is therefore desirable to design a programmable logic structure employing configurable logic blocks with a set of logic functions to provide more programmable features.

SUMMARY OF THE INVENTION

The present invention describes a dedicated logic cell in a programmable logic structure that is constructed with the following primary components: a configurable logic function or look-up table (LL), a dedicated logic function (DL), a sequential logic function (LS), and a control logic function (LC). In this illustration, the dedicated logic cell comprises two configurable logic functions, two sequential logic functions, a dedicate logic function, and a control logic function. In a first embodiment, the dedicated logic cell is constructed with a combination of configurable logic functions that are coupled to a dedicated logic function in order to perform a four 2-input function an AND function, an OR function, or an XOR function. In a second embodiment, the dedicated logic cell is constructed with a combination of configurable logic functions that are coupled to a dedicated logic function in order to perform a four 2-to-1 multiplexer function. In a third embodiment, the dedicated logic cell is constructed with a plurality of configurable logic functions that operate as a two 6-input function with separate inputs. In a fourth embodiment the dedicated logic cell is constructed with a combination of a configurable logic function with sequential logic functions that operate as a loadable, resettable, clearable shift register. In a fifth embodiment, the dedicated logic cell is constructed with a combination of configurable logic functions, a dedicated logic function, and sequential logic functions that operate as an accumulator.

In addition, the present invention describes logic circuits for the functional components in the dedicated logic cell. In a first aspect of the invention, a configurable logic function comprises a plurality of look-up tables coupled to a multiplexer with configurable bits that is capable to perform as a four 4-input look-up table or a one 6-input look-up table, and a 4-to-1 multiplexer function. In a second aspect of the invention, a sequential logic function comprises one or more multiplexers coupled to a configurable register that is capable to perform one of the following functions, a positive latch, a negative latch, a rising edge triggered flop, or a fallen edge triggered flop in combination with one of the following control signals, a loadable register signal, a synchronous clear signal, a synchronous set signal, and a data enable signal. In a third aspect of the invention, a dedicated logic function comprises a plurality of multiplexers for selecting between different functional operations, such as an adder function, an accumulator function, or a shift data function, with selecting signals connected to the plurality of multiplexer that either remain static or dynamic configurable to achieve an arithmetic logic unit functionality. Alternatively, the dedicated logic function can be implemented to operate as a propagate and generate logic to perform the function of a look-ahead sum or as a priority multiplexer. In a fourth aspect of the invention, a control logic function comprises a plurality of multiplexers with pre-calculated results for minimizing the delay produced from a lower dedicate logic function to an upper dedicated logic function.

Broadly stated, Claim 1 recites a dedicated logic cell that comprises a first configurable logic function having at least one input and at least one output; a dedicated logic function having at least one input and at least one output the at least one input of the dedicated logic function coupled to the at least one output of the first configurable logic function; and a first sequential logic function having at least one input and at least one output, the least one input of the first sequential logic function coupled to the at least one output of the dedicated logic function.

Other structures and methods are disclosed in the detailed description below. This summary does not purport to define the invention. The invention is defined by the claims. These and other embodiments, features, aspects, and advantages of the invention will become better understood with regard to the following description, appended claims and accompanying drawings.

FIG, 7 is a logic diagram illustrating the sequential logic function (LS structure) in the dedicated logic cell in accordance with the present invention.

Figure 8:
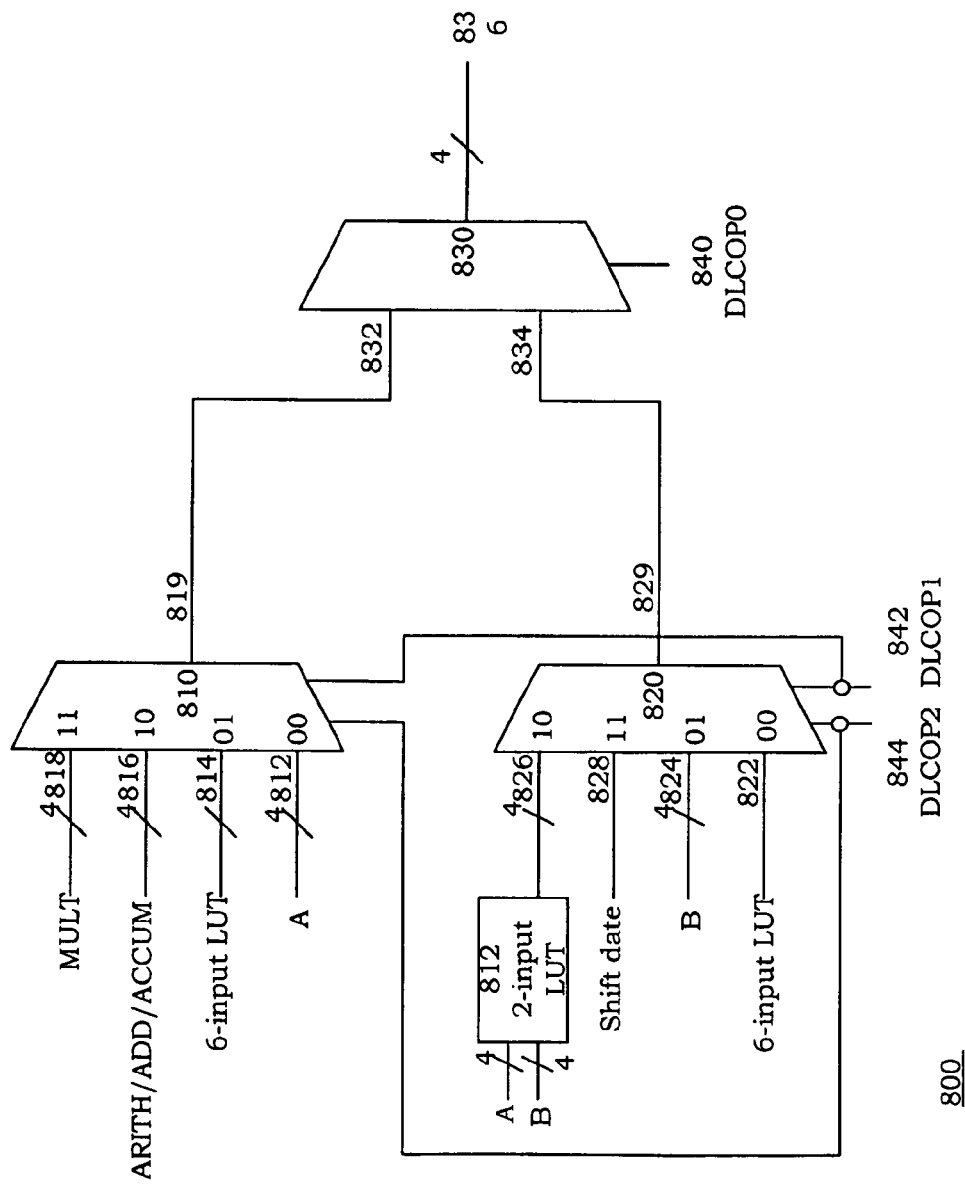

FIG. 8 is logic diagram illustrating the dedicated logic function (LD structure) in the dedicated logic cell in accordance with the present invention.

Figure 9:
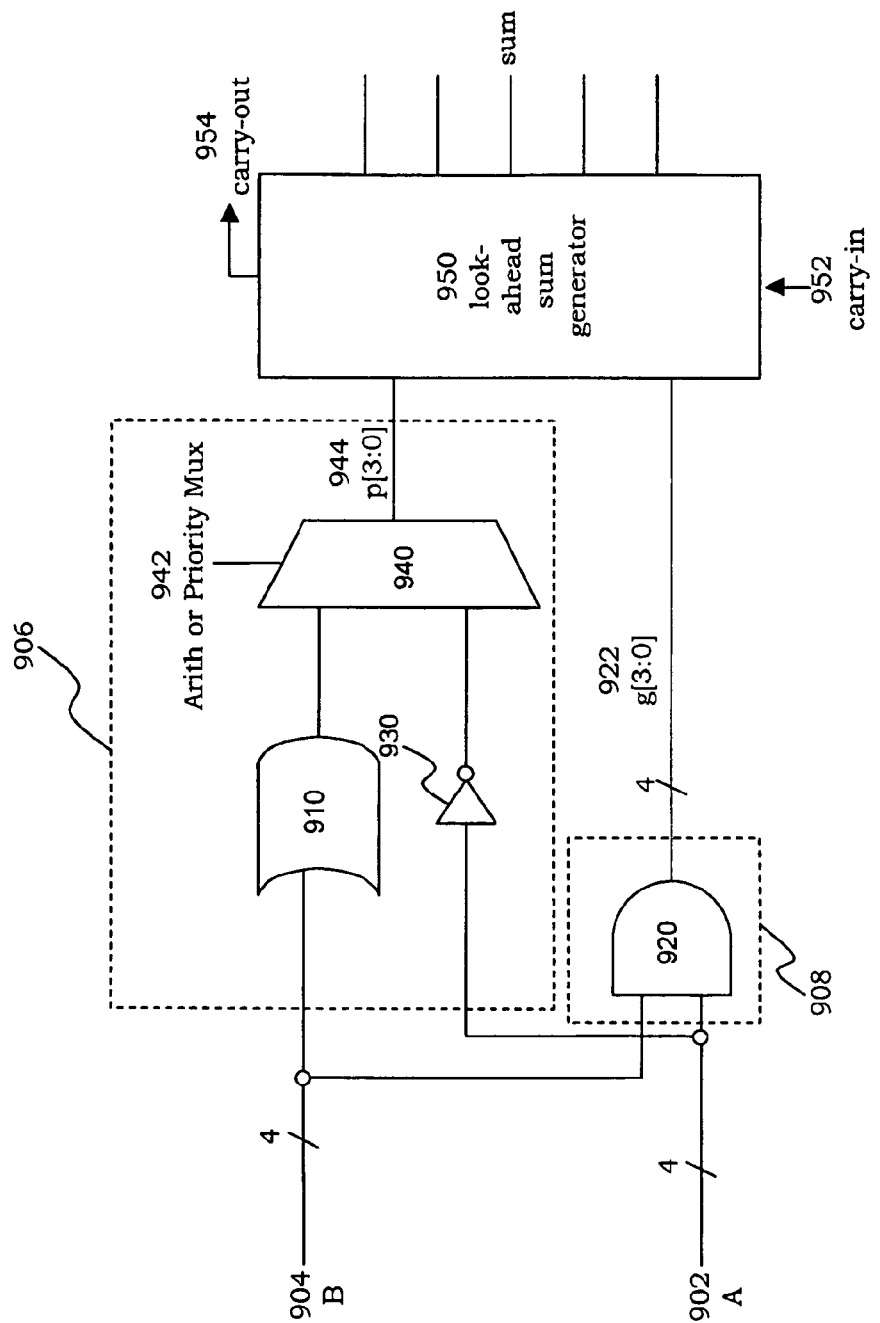

FIG. 9 is a logic circuit illustrating an alternative embodiment of the dedicated logic function that operates as a propagate/generate logic to perform the function of a look-ahead sum or as a priority multiplexer in accordance with the present invention.

Figure 10:
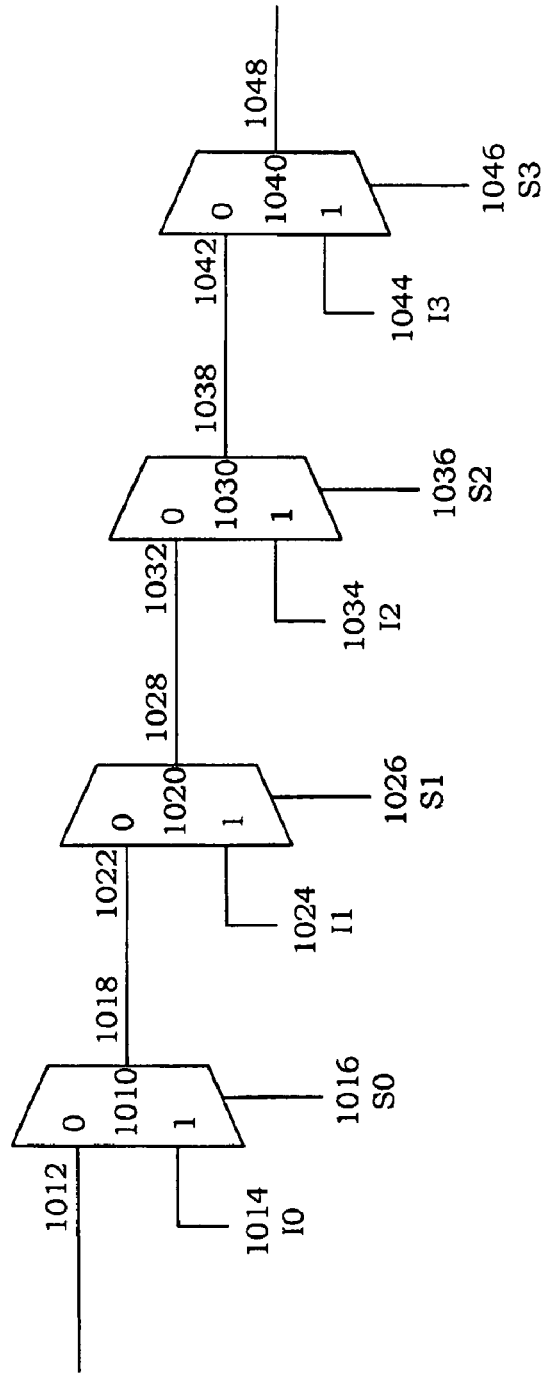

FIG. 10 is a logic diagram illustrating an example of a priority multiplexer as described with respect to the dedicated logic cell as shown in FIG. 10 for use in a carry-ahead carry generation scheme in accordance with the present invention.

Figure 11:
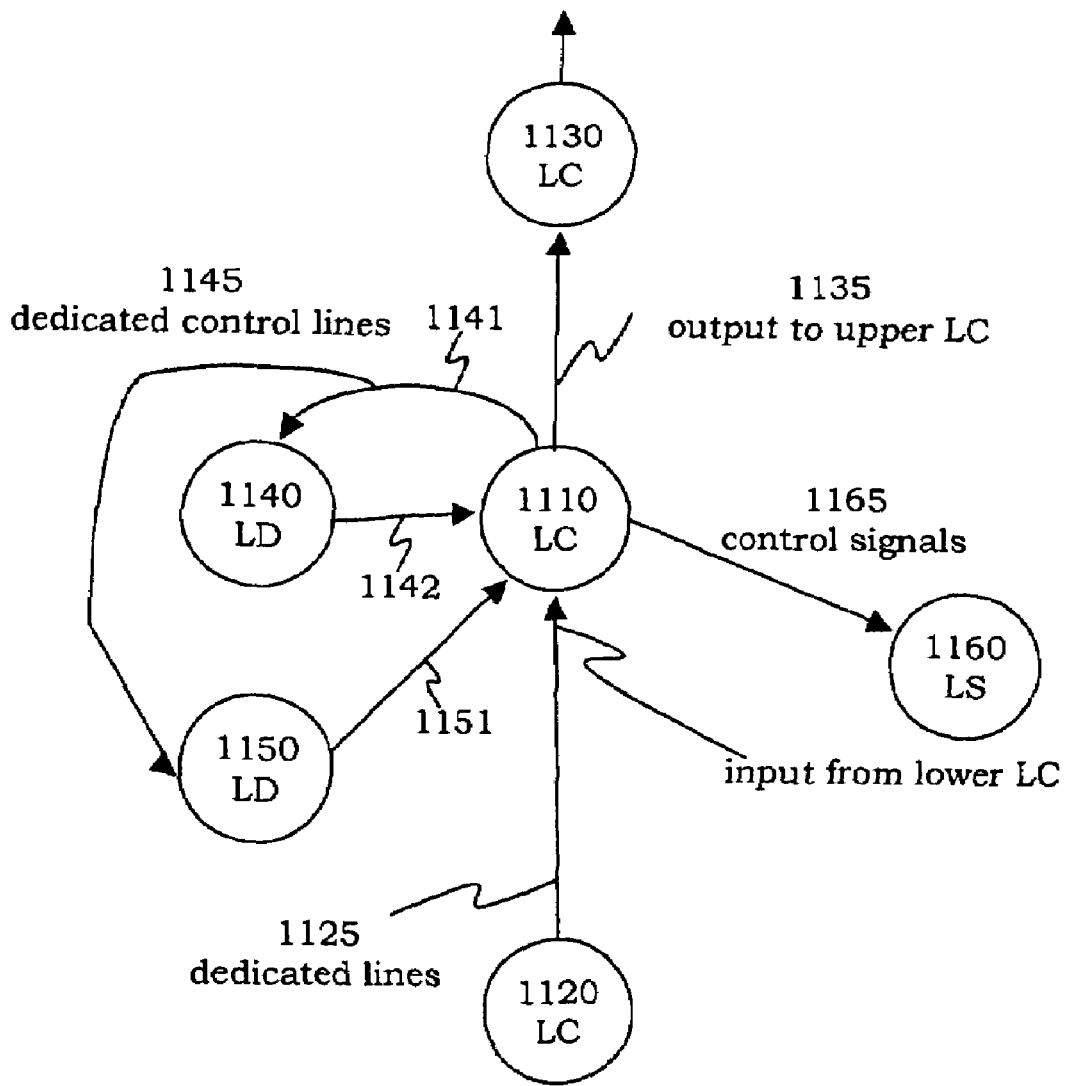

FIG. 11 is state diagram illustrating of the control logic function (LC structure) in the dedicated logic cell in accordance with the present invention.

Figure 12:
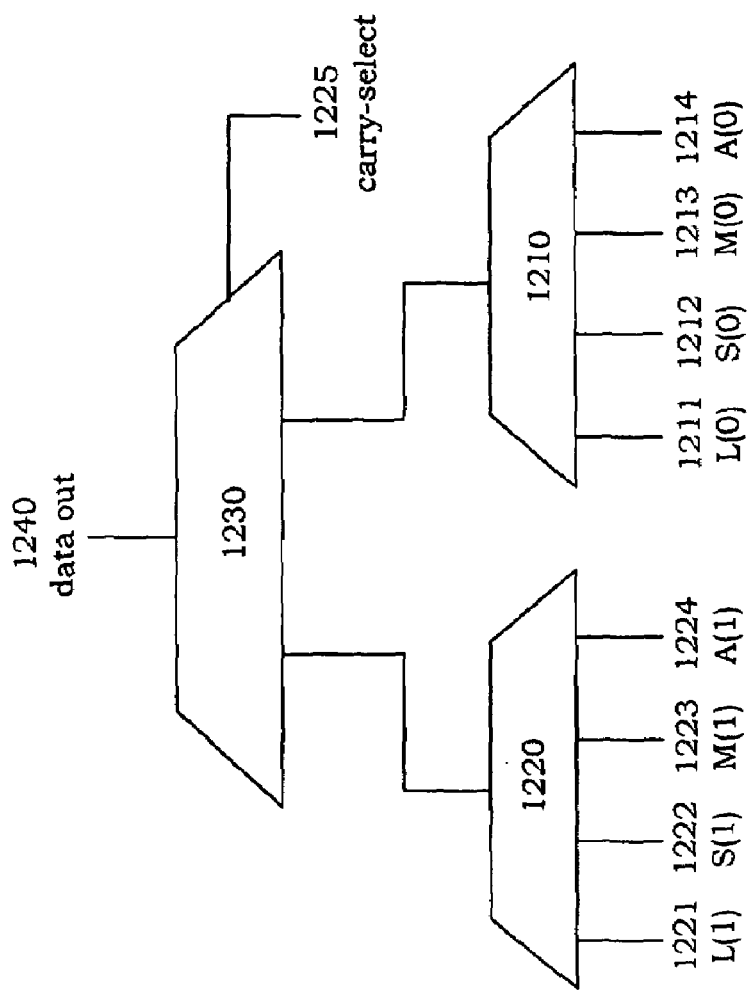

FIG. 12 is logic diagram illustrating an example of a control logic function in accordance with the present invention.

Figure 13:
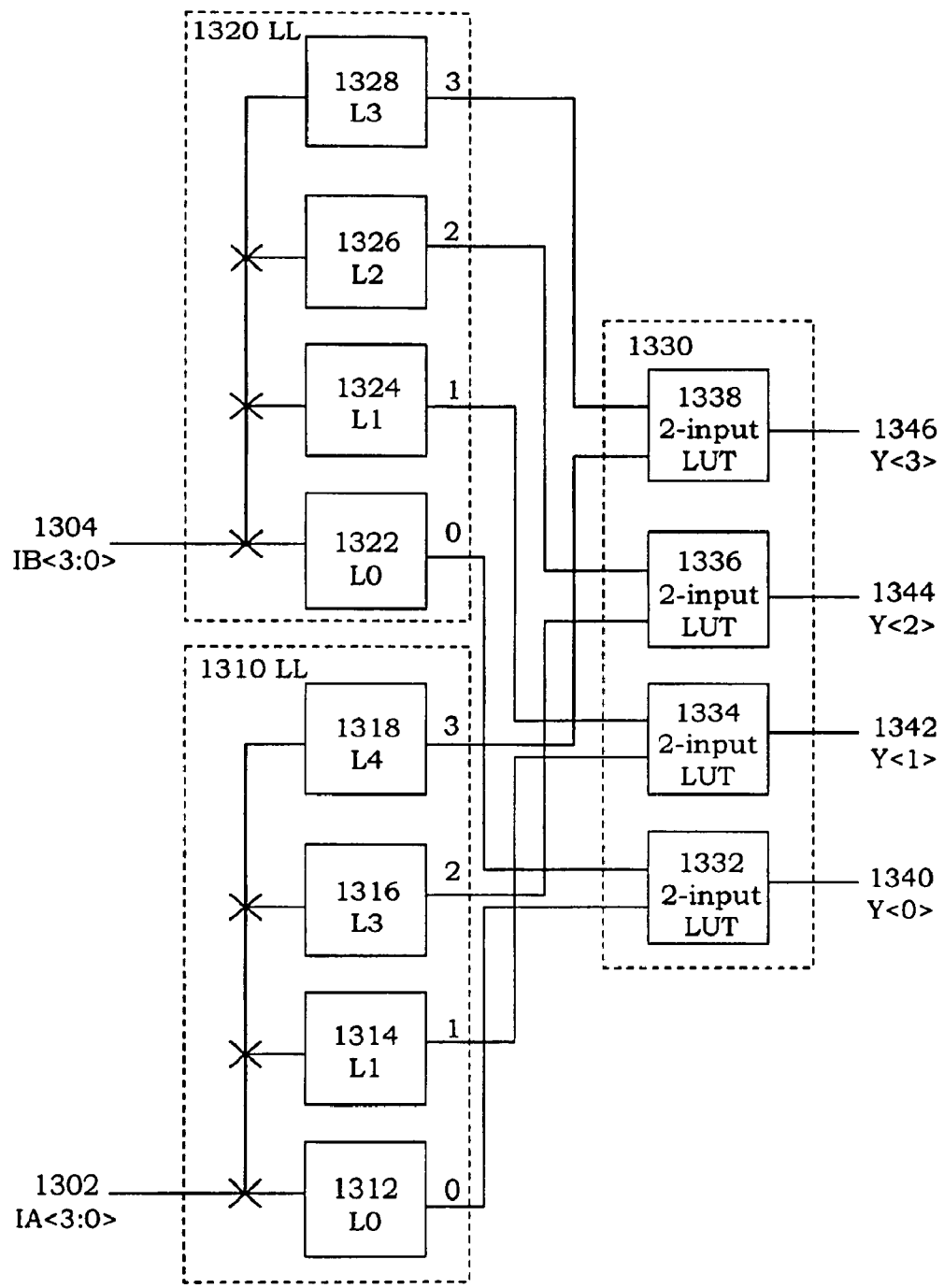

FIG. 13 is a logic circuit illustrating a first embodiment of the dedicated logic cell implemented as a four 2-input function employing configurable logic functions and a dedicated logic function in accordance with the present invention.

Figure 14:
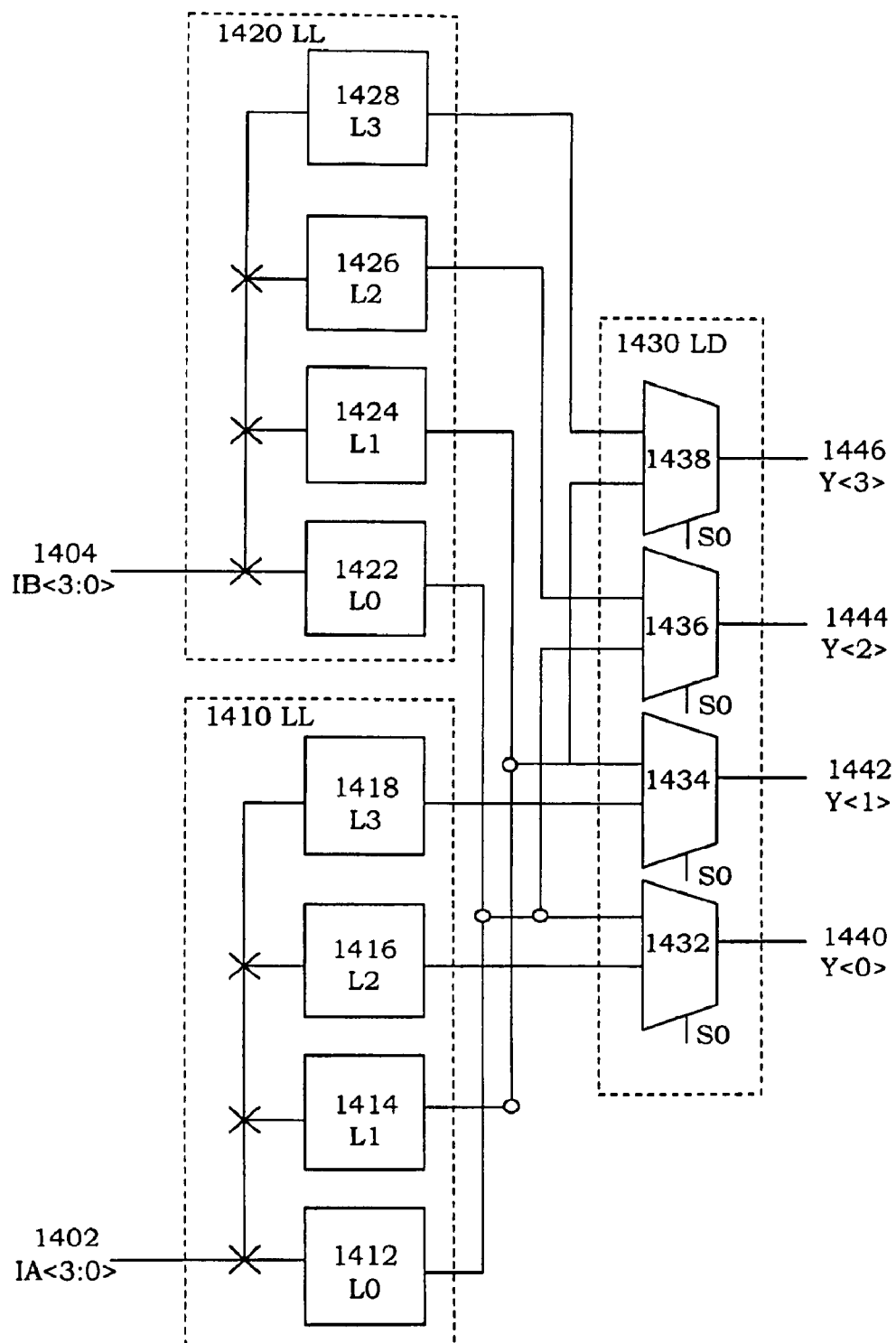

FIG. 14 is a logic circuit illustrating a second embodiment of the dedicated logic cell implemented as a four 2:1 multiplexer employing configurable logic functions and a dedicated logic function in accordance with the present invention.

Figure 15:
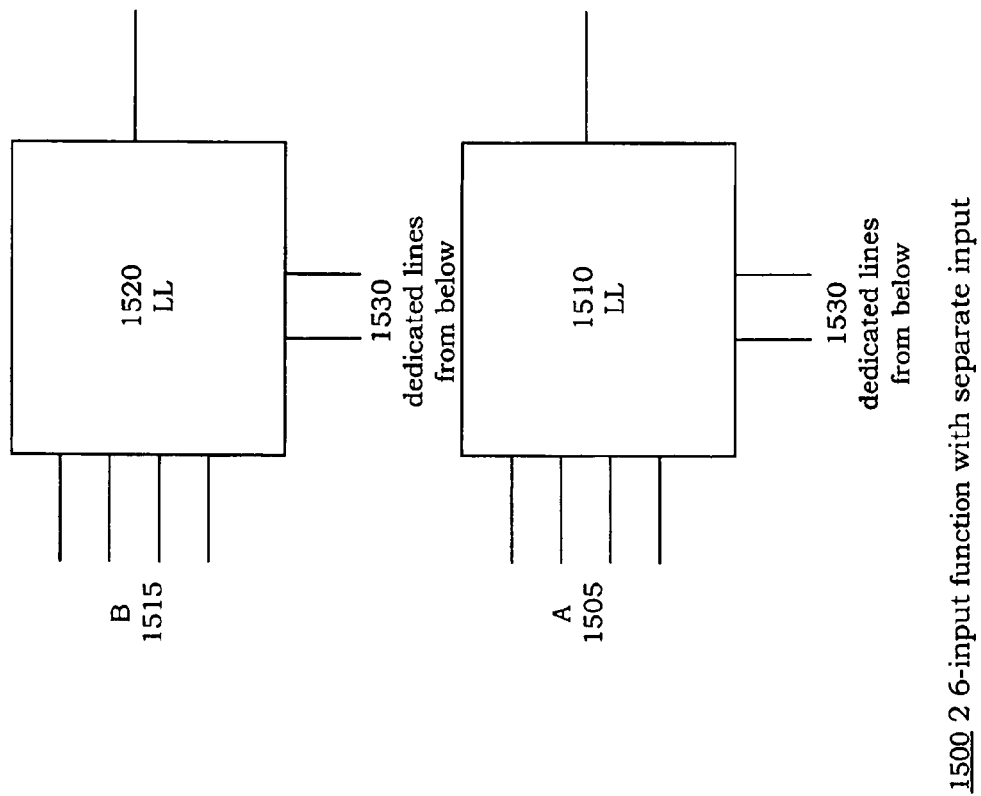

FIG. 15 is a block diagram illustrating a third embodiment of the dedicated logic cell implemented as a two 6-input functions of configurable logic functions with separate inputs having a first configurable logic function and a second configurable logic function in accordance with the present invention.

Figure 16:
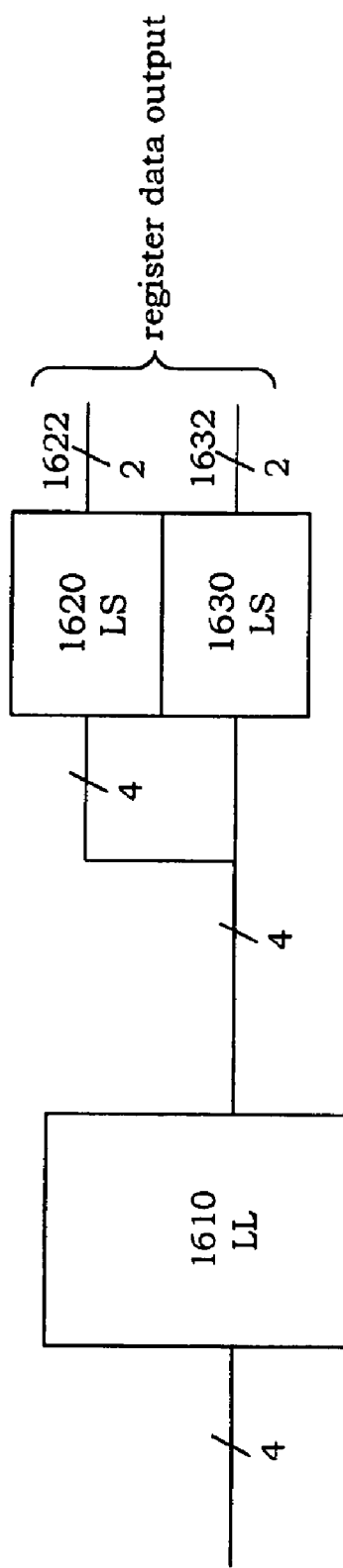

FIG. 16 is a logic diagram illustrating a fourth embodiment of the dedicated logic cell implemented as a shift register which is capable of performing a loadable, resettable, or clearable function by using a combination of a configurable logic function and sequential logic functions in accordance with the present invention.

Figure 17:
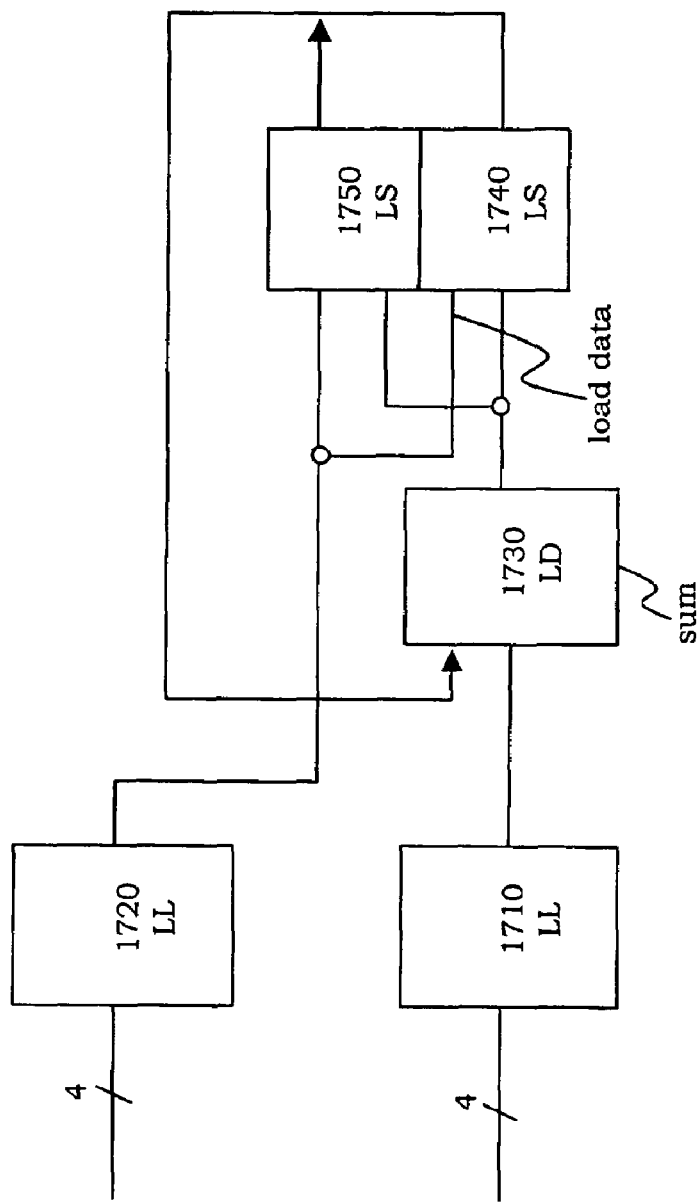

FIG. 17 is a logic diagram illustrating a fifth embodiment of the dedicated logic cell implemented as an accumulator by employing configurable logic functions, a dedicate logic function, and sequential logic functions in accordance with the present invention.

Figure 18:
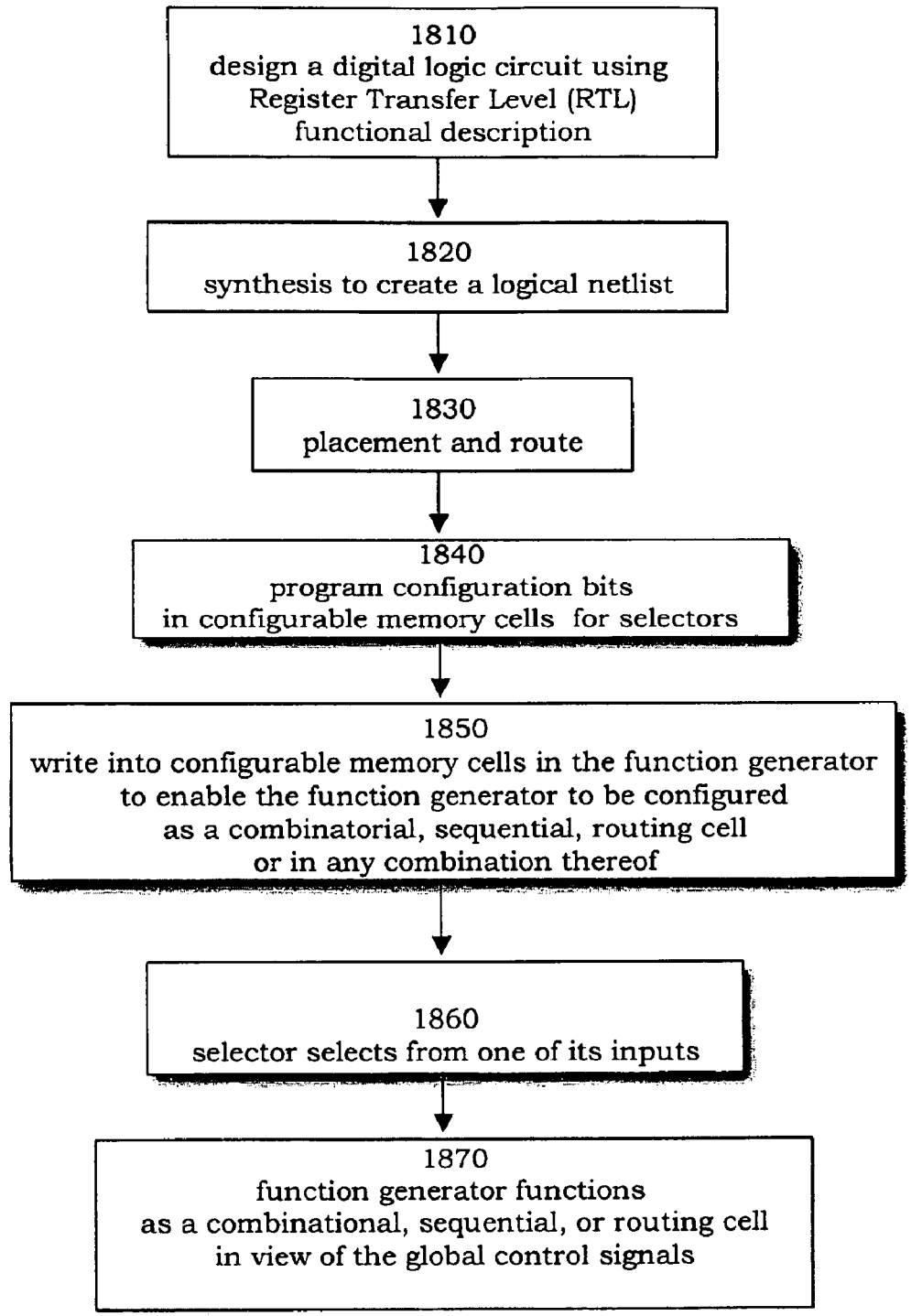

FIG. 18 is a flow diagram illustrating a method for programming configuration bits for configuring one or more programmable function generators in accordance with the present invention.

Reference symbols or names are used in the Figures to indicate certain components, aspects or features therein, with reference symbols common to more than one Figure indicating like components, aspects or features shown therein.

DETAILED DESCRIPTION OF PREFERRED EMBODIMENTS

Figure 1:
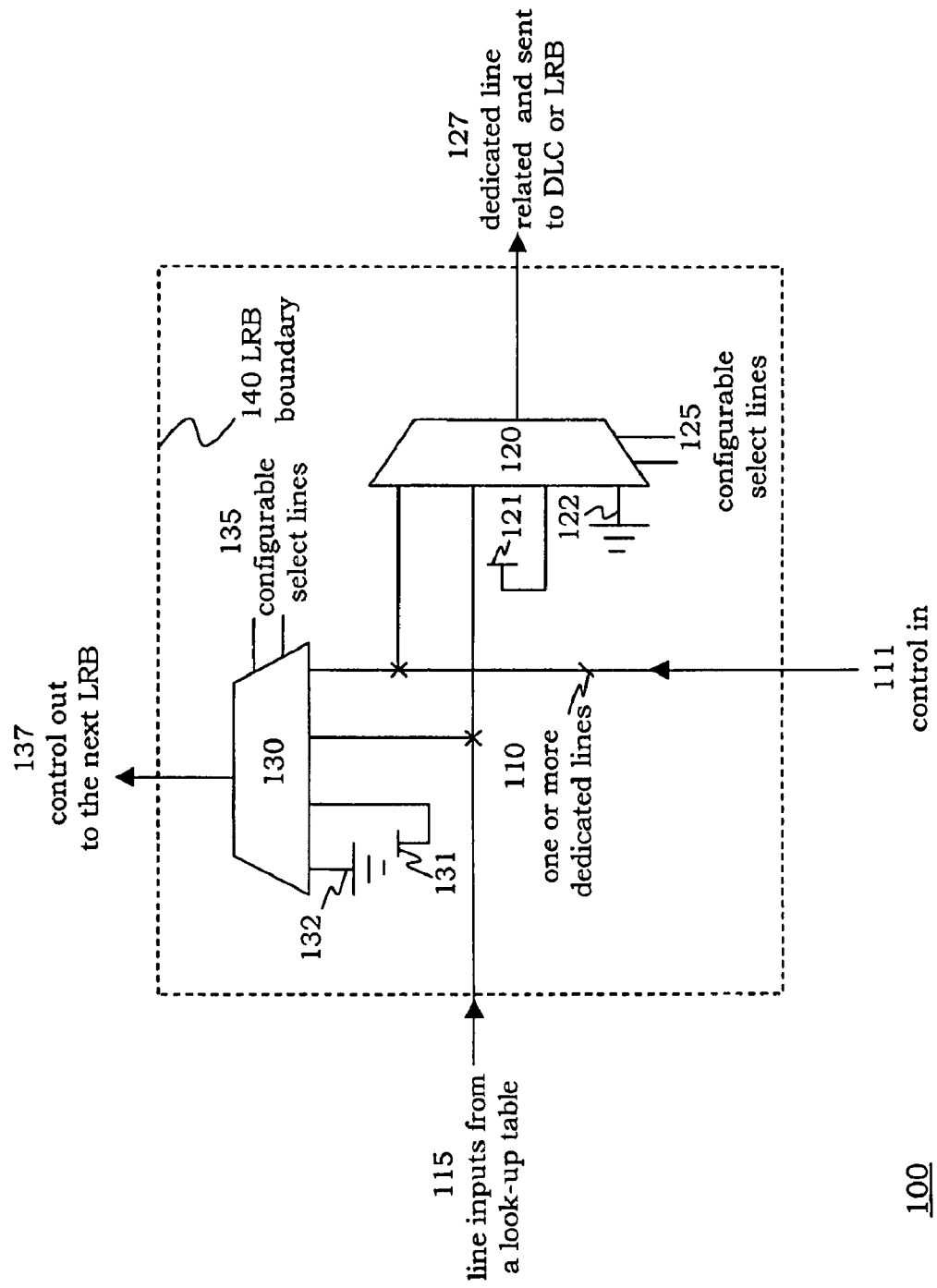
FIG. 1 is a logic diagram illustrating a partial dedicated logic cell employing the use of one or more dedicated lines for connections between logic and routing blocks (LRBs), or connections from one dedicated logic cell (DLC) to another dedicated logic cell in accordance with the present invention.

Referring now to FIG. 1, there is shown a logic diagram illustrating a partial dedicated logic cell 100 employing the use of one or more dedicated lines 110 for connections between logic and routing blocks (LRBs), or connections from one dedicated logic cell (DLC) to another dedicated logic cell. The one or more dedicated lines 110 enter the partial dedicated logic cell 100 in a present logic and routing block through a control input line 111. The first multiplexer 120 has a first input connected to the control input 111 for receiving the one or more dedicated lines 110, a second input connected to line inputs 115 from a look-up table, a third input connected to a Vdd 121, and a fourth input connected a ground 122, and an output 127 connected to an adjacent dedicated logic cell in the same logic and routing block. Configurable select lines 125 allows selection from one of the four inputs 110, 115, 121, or 122 in the first multiplexer 120 or generating the output 127 to the adjacent dedicated logic cell in the same logic and routing block. The second multiplexer 130 has a first input connected to a control input 111 for receiving the one or more dedicated lines 110, a second input connected to line inputs 115 from the look-up table, a third input connected to a Vdd 131, and a fourth input connected a ground 132, and an output 137 connected to the next logic and routing block (or the next dedicated logic cell.) Configurable select lines 135 allow selection from one of the four inputs, 111, 115, 131, or 132 in the second multiplexer 130 to the next logic and routing block.

The logic and routing blocks that provide the additional inputs need not be adjacent to the current logic and routing block where the function is implemented. The one or more dedicated lines can be used either as data or control signals. By deploying the one or more dedicated lines, the connectivity of a logic and routing block for enabling input and output connections can be made seamlessly irrespective of a logic and routing block boundary 140. The one or more dedicated lines 110 connect between logic and routing blocks that allow a logic and routing block to receive inputs from other logic and routing blocks when a given function implemented in the logic and routing block requires more inputs than provided by the switchbox 250 in the logic and routing block. The one or more dedicated lines 110 also allow the logic and routing block to drive more outputs than provided by the present logic and routing block.

Figure 2:
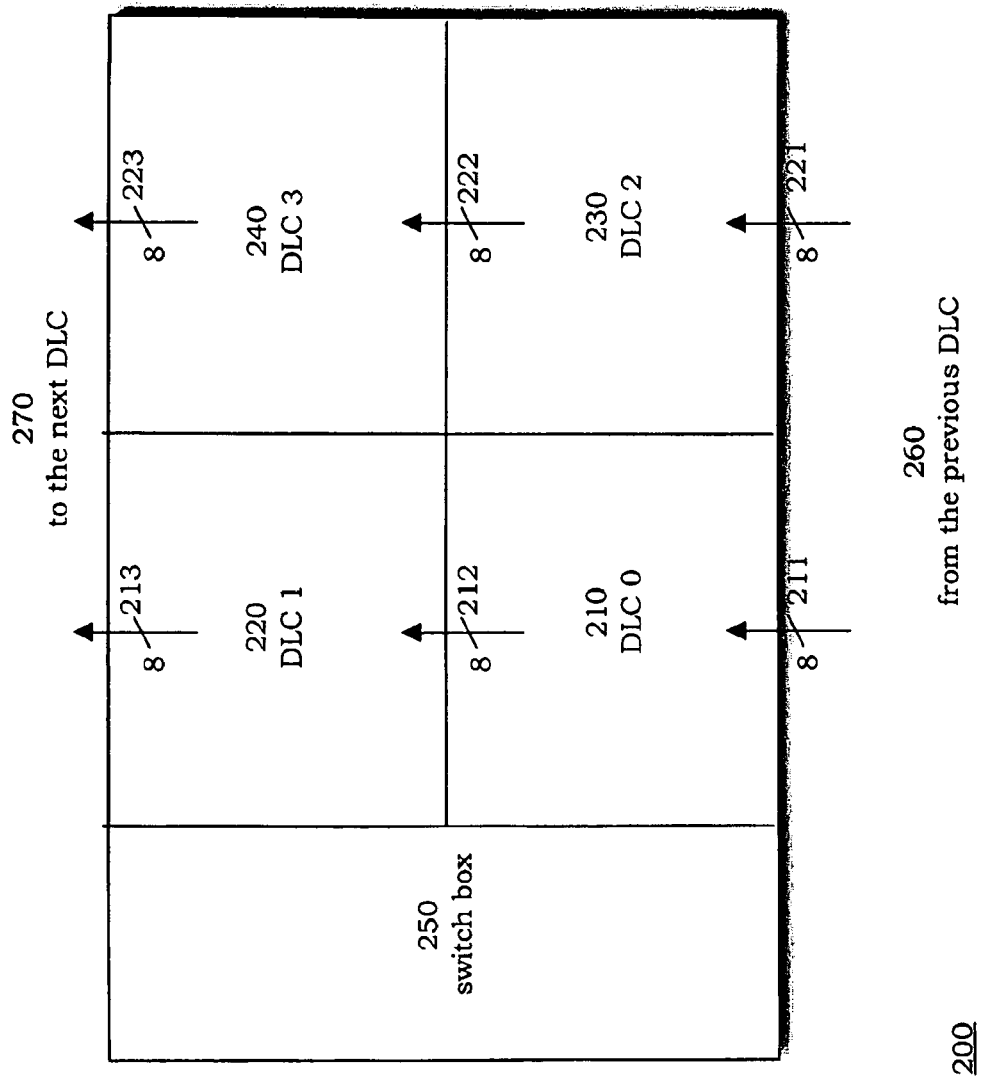
FIG. 2 is an architectural diagram illustrating a logic and routing block comprising a first dedicated logic cell, a second dedicated logic cell, a third dedicated logic cell, a fourth dedicated logic cell and a switch box for providing programmable switch matrices in accordance with the present invention.

In this embodiment, the partial dedicated logic cell 100 employs eight dedicated lines 110 for each pair of dedicated logic cells. The eight dedicated lines 110 can be used as either data or control signal lines for various modes of operation. The eight dedicated lines are fed by eight outputs of a dedicated logic cell (not shown) or from a previous set of dedicated lines (not shown). Each dedicated line in the eight dedicated lines 110 can be tied to a high or low voltage. The eight dedicated lines 110 are fed to functional blocks to enable creation of larger functional blocks than permissible from a switch box, as shown in FIG. 2. For example, six and seven inputs general purpose function generators (i.e., look-up tables or "LUTs") and 8-input limited function generators are possible by using the dedicated input lines to provide inputs from other logic and routing blocks.

In FIG. 2, there is shown an architectural diagram illustrating a logic and routing block 200 comprising a first dedicated logic cell (DLC 0) 210, a second dedicated logic cell (DLC 1) 220, a third dedicated logic cell (DLC 2) 230, a fourth dedicated logic cell (DLC 3) 240 and a switch box 250 for providing programmable switch matrices. A set of dedicated lines is used to interconnect between adjacent dedicated logic cells, either for connects to adjacent dedicated logic cells within the logic and routing block, adjacent dedicated logic cells between the logic and routing block 200 and a previous logic and routing block, or connecting to adjacent dedicated logic cells between the logic routing block 200 and a next logic and routing block. A first set of eight dedicated lines 211 is corrected from a previous dedicated logic cell 260 (not shown) to the first dedicated logic cell 210. A second set of eight dedicated lines 212 is connected from the first dedicated logic cell DLC0 210 to the second dedicated cell DLC1 220. A third set of dedicated line 213 is connected from the second dedicated cell 220 to the next dedicated local cell 270 (not shown). A fourth set of eight dedicated lines 221 is connected from the previous dedicated logic cell 260 (not shown) to the third dedicated logic cell 230. A fifth set of eight dedicated lines 222 is connected from the third dedicated logic cell 230 to the fourth dedicated logic cell 240. A sixth set of eight dedicated lines 223 is connected from the fourth dedicated logic cell 240 to the next dedicated logic cell 270 (not shown). The switchbox 250 functions as a source for feeding control of data signals to any one of the dedicated lines 211, 212, 213, 221, 222, or 223. While the first set of eight dedicated lines 211 and the fourth set of eight dedicated lines 221 are connected from the previous logic and cell block 260, (not shown) the third set of eight dedicated lines 213 and the sixth set of eight dedicated lines 223 are connected to the next logic and cell block 270 (not shown).

The one or more dedicated line can be driven by the previous corresponding one or more dedicated lines as well as driving the next corresponding one or more dedicated lines, which would extend the distance of the dedicated lines. In effect, one set of dedicated lines can be connected ("stitched") to another set of dedicated lines, as may be called for by a particular programmable logic device, for concatenating different sets of dedicated lines together that extend across different logic and routing blocks.

Figure 3:
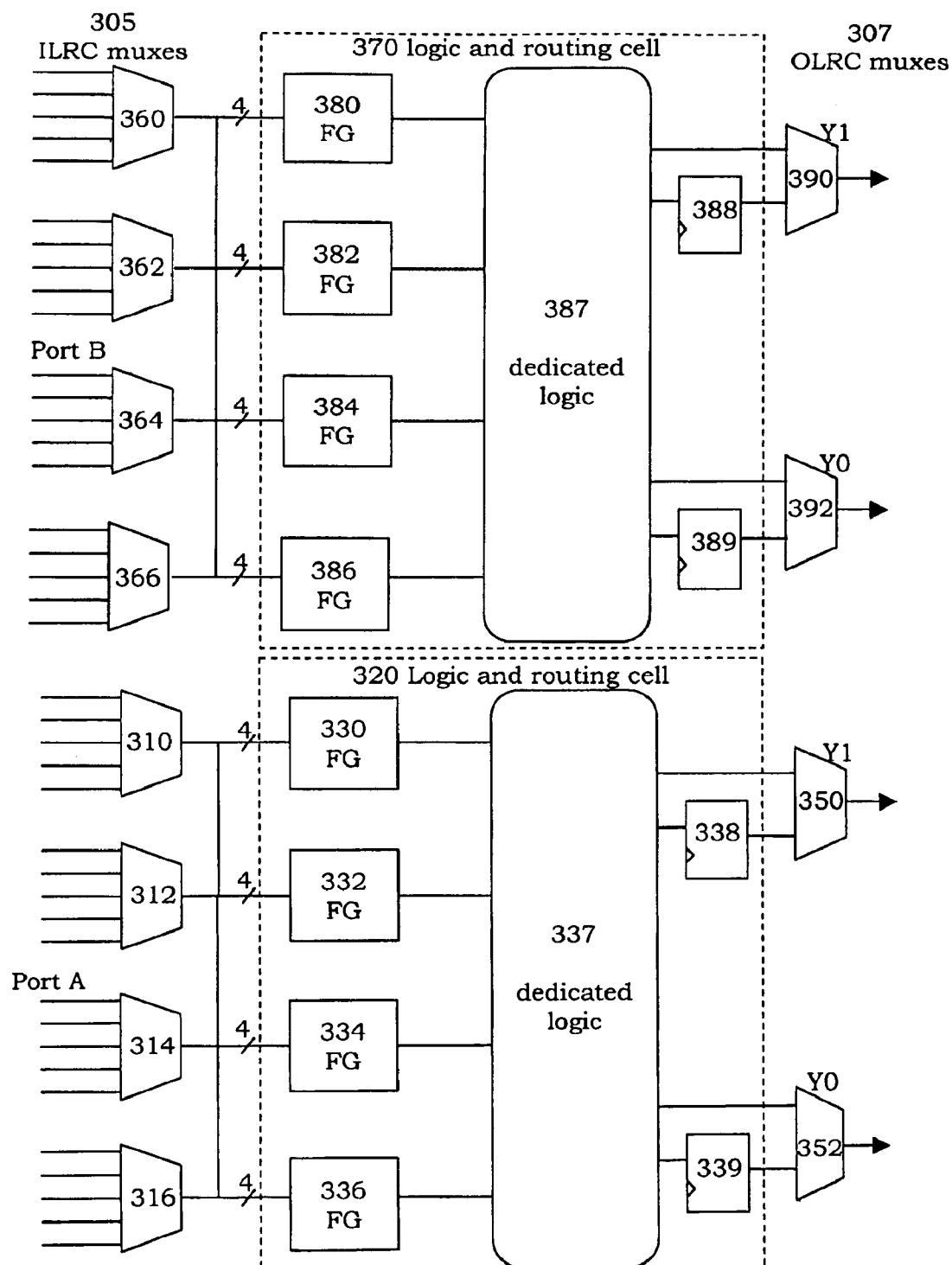
FIG. 3 is a logic diagram illustrating a dedicated logic structure in a two multiplexers scheme employing a first logic and routing cell for port A and a second logic and routing cell for port B in accordance with the present invention.

In FIG. 3, there is shown a logic diagram illustrating a dedicated logic structure 300 in a two multiplexers scheme employing a first logic and routing cell (LRC) 320 for port A and a second logic and routing cell 370 for port B, a set of ILRC multiplexers 305 connected to in-puts of the first and second LRCs 320 and 370, and a set of OLRC multiplexers 307 connected to outputs of the first and second LRCs 320 and 370. The first logic and routing cell 320 for port A comprises four look-up tables (or functional generators, FGs) 330, 332, 334, and 336, a dedicated logic 337, and two configurable registers 338 and 339. The first logic and routing cell 320 couples between four ILRC multiplexers 310, 312, 314, and 316, and two OLRC multiplexers 350 and 352 The first ILRC multiplexer 310 feeds into the first look-up table 330, the second ILRC multiplexer 312 feeds in to the second look-up table 332, the third ILRC multiplexer 314 feeds into the third look-up table 334, and the fourth ILRC multiplexer 316 feeds into the fourth look-up table 336. The four took-up tables 330, 332, 334 and 336 are coupled to the dedicated logic 337. The dedicated logic 337 is configurable to perform selected functionalities depending on a product specification. The first OLRC multiplexer 350 selects between a first input generated from the dedicated logic 337 or the second input generated from the first configurable register 338 in generating an output. The second OLRC multiplexers 352 selects between a first input generated from the dedicated logic 337 or the second input generated from the second configurable register 239 in generating an output.

The second logic and routing cell 370 for port B comprises four look-up tables (or functional generators, FGs) 380, 382, 384, and 386, a dedicated logic 387, and two configurable registers 388 and 389. The second logic and routing cell 370 couples between four ILRC multiplexers 360, 362, 364, and 366, and two OLRC multiplexers 390 and 392. The first ILRC multiplexer 360 feeds in to the first look-up table 380, the second ILRC multiplexer 362 feeds into the second look-up table 382, the third. ILRC multiplexer 364 feeds into the third look-up table 384, and the fourth ILRC input multiplexer 366 feeds into the fourth look-up table 386. The four look-up tables 380, 382, 384, and 386 are coupled to the dedicated logic 387. The dedicated logic 387 is configurable to perform selected functionalities depending on a product specification. The first OLRC multiplexer 390 selects between a first input generated from the dedicated logic 387 or the second input generated from the first configurable register 388 in generating an output. The second OLRC multiplexers 392 selects between a first input generated from the dedicated logic 387 or the second input generated from the second configurable register 389 in generating an output.

One of ordinary skill in the art should recognize that FIG. 3 is intended as one embodiment such that other variations or modifications can be practiced without departing from the spirits of the present invention, e.g. a different number of ILRC multiplexers rather than four, or a different number of OLRC multiplexers rather than two.

Figure 4:
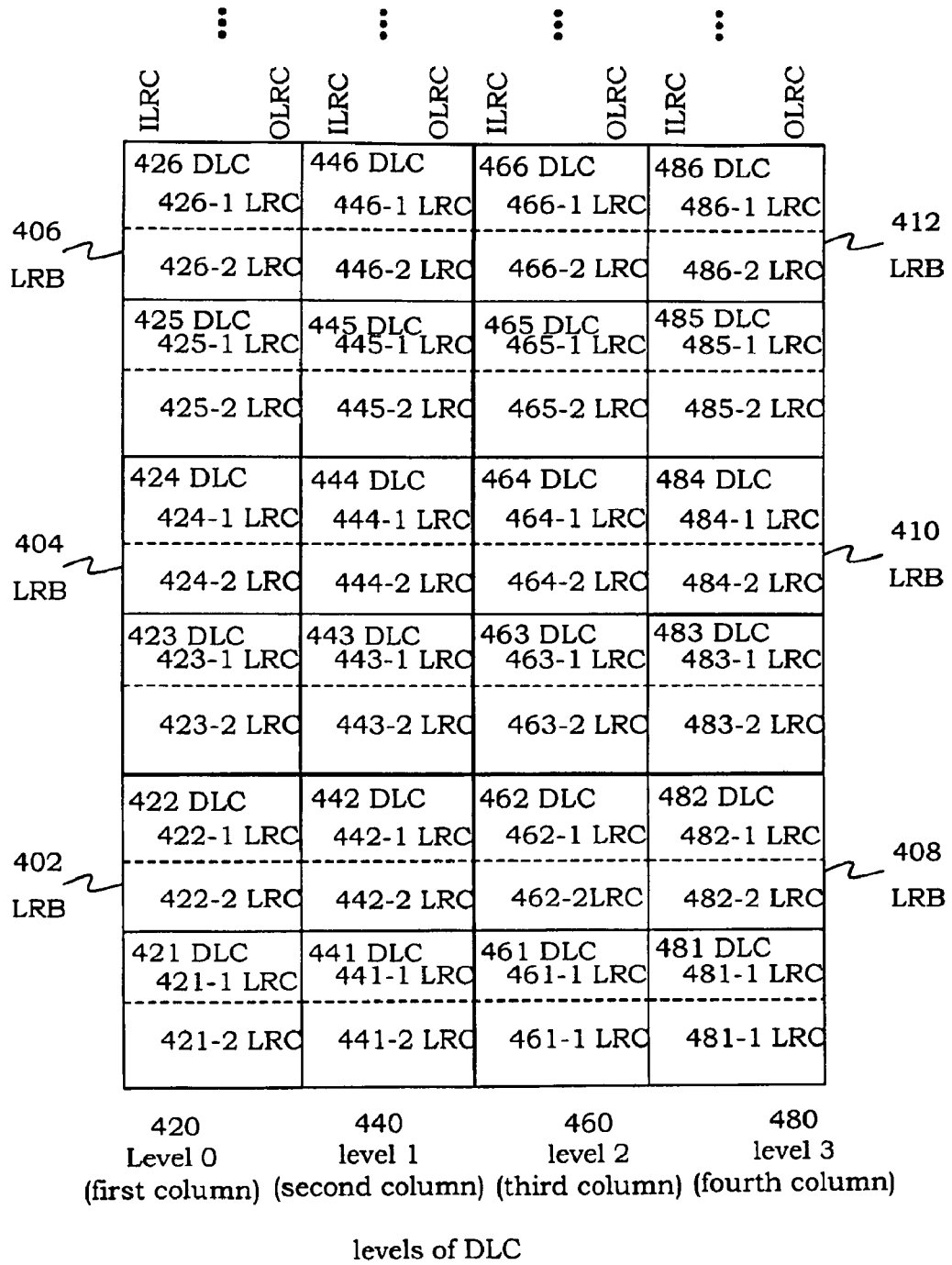
FIG. 4 is a logic diagram illustrating a programmable logic chip constructed with multiple levels in accordance with the present invention.

In FIG. 4, there is shown a logic diagram illustrating a programmable logic chip 400 constructed with multiple levels (or columns) of DLCs 420, 440, 460, and 480. One column of dedicated logic cell comprises a plurality of dedicated logic cells and connection lines to implement a logic function, such as an adder, a subtractor, an add-subtractor with add-sub control, an accumulator, registers, and multiplexers.

The programmable logic chip 400 comprises a first logic and routing block 402, a second logic and routing block 404, a third logic and routing block 406, a fourth logic and routing block 408, a fifth logic and routing block 410, and a sixth logic and routing block 412. Each of the logic and routing block comprises four dedicated logic cells arranged in a square format. The first logic and routing block 402 comprises a first dedicated logic cell 421, a second dedicated logic cell 422, a third dedicated logic cell 441, and a fourth dedicated logic cell 442. Each dedicated logic cell comprises two logic and routing cells. The first dedicated logic cell 421 has a first logic and routing cell 421-1 and a second logic and routing cell 421-2, the second dedicated logic cell 422 has a first logic and routing cell 422-1 and a second logic and routing cell 422-2, the third dedicated logic cell 441 has a first logic and routing cell 441-1 and a second logic and routing cell 441-2, and the fourth dedicated logic cell 442 has a first logic and routing cell 442-1 and a second logic and routing cell 442-2.

The second logic and routing block 404 comprises a first dedicated logic cell 423, a second dedicated logic cell 424, a third dedicated logic cell 443, and a fourth dedicated logic cell 444. The first dedicated logic cell 423 has a first logic and routing cell 423-1 and a second logic and routing cell 423-2, the second dedicated logic cell 424 has a first logic and routing cell 424-1 and a second logic and routing cell 424-2, the third dedicated logic cell 443 has a first logic and routing cell 443-1 and a second logic and routing cell 443-2, and the fourth dedicated logic cell 444 Las a first logic and routing cell 444-1 and a second logic and routing cell 444-2.

The third logic and routing block 406 comprises a first dedicated logic cell 425, a second dedicated logic cell 426, a third dedicated logic cell 445, and a fourth dedicated logic cell 446. The first dedicated logic cell 425 has a first logic and routing cell 425-1 and a second logic and routing cell 425-2, the second dedicated logic cell 426 has a first logic and routing cell 426-1 and a second logic and routing cell 426-2, the third dedicated logic cell 445 has a first logic and routing cell 445-1 and a second logic and routing cell 445-2, and the fourth dedicated logic cell 446 has a first logic and routing cell 446-1 and a second logic and routing cell 446-2.

The fourth logic and routing block 408 comprises a first dedicated logic cell 461, a second dedicated logic cell 462, a third dedicated logic cell 481, and a fourth dedicated logic cell 482. The first dedicated logic cell 461 has a first logic and routing cell 461-1 and a second logic and routing cell 461-2, the second dedicated logic cell 462 has a first logic and routing cell 462-1 and a second logic and routing cell 462-2, the third dedicated logic cell 481 has a first logic and routing cell 481-1 and a second logic and routing cell 481-2, and the fourth dedicated logic cell 482 as a first logic and routing cell 482-1 and a second logic and routing cell 482-2.

The fourth logic and routing block 410 comprises a first dedicated logic cell 461, a second dedicated logic cell 462, a third dedicated logic cell 483, and a fourth dedicated logic cell 484. The first dedicated logic cell 463 has a first logic and routing cell 463-1 and a second logic and routing cell 463-2, the second dedicated logic cell 464 has a first logic and routing cell 464-1 and a second logic and routing cell 464-2, the third dedicated logic cell 483 has a first logic and routing cell 483-1 and a second logic and routing cell 483-2, and the fourth dedicated logic cell 484 has a first logic and routing cell 484-1 and a second logic and routing cell 484-2.

The sixth logic and routing block 412 comprises a first dedicated logic cell 465, a second dedicated logic cell 466, a third dedicated logic cell 485, and a fourth dedicated logic cell 486. The first dedicated logic cell 465 has a first logic and routing cell 465-1 and a second logic and routing cell 465-2, the second dedicated logic cell 466 has a first logic and routing cell 466-1 and a second logic and routing cell 466-2, the third dedicated logic cell 485 has a first logic and routing cell 485-1 and a second logic and routing cell 485-2, and the fourth dedicated logic cell 486 has a first logic and routing cell 486-1 and a second logic and routing cell 486-2.

The first column (or level 0) of logic and routing block 420 comprises the first dedicated logic cell 421, the second dedicated logic cell 422, the third dedicated logic cell 423, the fourth dedicated logic cell 424, the fifth dedicated logic cell 425, and the sixth dedicated logic cell 426. The second column (or level 1) of logic and routing block 440 is positioned adjacent to the right side of the first column of logic and routing block 420. The second column of logic and routing block 440 comprises the first dedicated logic cell 441, the second dedicated logic cell 442, the third dedicated logic cell 443, the fourth dedicated logic cell 444, the fifth dedicated logic cell 445, and the sixth dedicated logic cell 446. The third column (or level 2) of logic and routing block 460 is positioned adjacent to the right side of the second column of logic and routing block 440. The third column of logic and routing block 460 comprises the first dedicated logic cell 461, the second dedicated logic cell 462, the third dedicated logic cell 463, the fourth dedicated logic cell 464, the fifth dedicated logic cell 465, and the sixth dedicated logic cell 466. The fourth column (or level 3) of logic and routing block 480 is positioned adjacent to the right side of the third column of logic and routing block 460. The fourth column of logic and routing block 480 comprises the first dedicated logic cell 481, the second dedicated logic cell 482, a third dedicated logic cell 483, the fourth dedicated logic cell 484, the fifth dedicated logic cell 485, and the sixth dedicated logic cell 486.

Figure 5:
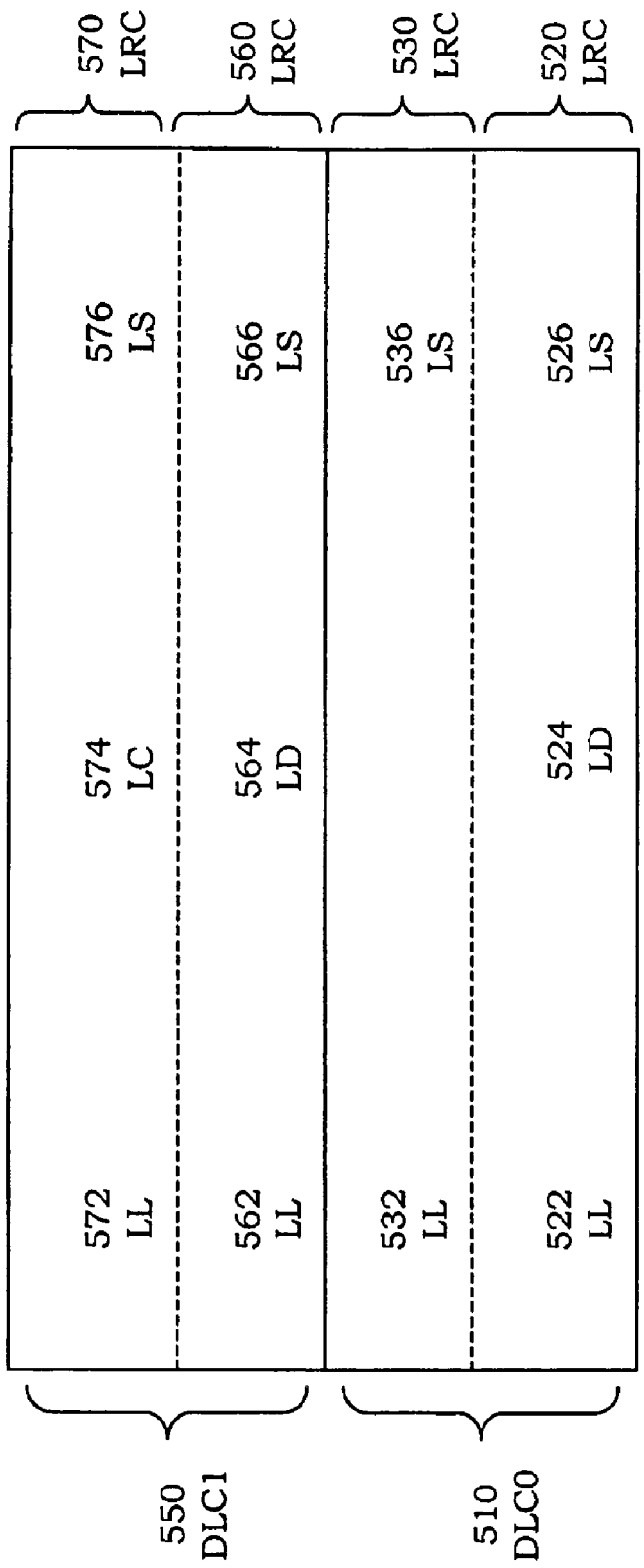
FIG. 5 is an architectural diagram illustrating a pair of dedicated logic cells comprising of four types of components: a configurable logic function or a look-up table, a dedicated logic function, a sequential logic function, and a control logic function in accordance with the present invention.

FIG. 5 is an architectural diagram illustrating a pair of dedicated logic cells 500 comprising of four types of components: a configurable logic function or a look-up table (LL), a dedicated logic function (LD), a sequential logic function (LS), and a control logic function (LC). A first dedicated logic cell DCL0 510 has a first IRC 520 and a second LRC 530 where the first LRC 520 comprises a first configurable logic function 522, a dedicated logic function 524, a sequential logic function 526, while the second IRC 530 comprises a second configurable logic function 532, and a sequential logic function 536. A second dedicated logic cell DCL1 550 has a first LRC 560 and a second LRC 570 where the first LRC 560 comprises a first configurable logic function 562, a dedicated logic function 564, a sequential logic function 566, while the second LRC 570 comprises a second configurable logic function 572, a control logic function 574, and a sequential logic function 576. A logic function can be implemented by using one or more dedicated logic cells in which a selected combination of logic circuits (i.e. a configurable logic function, a dedicated logic function, a sequential logic function, and/or a control logic function) are configured to perform that function.

Figure 6:
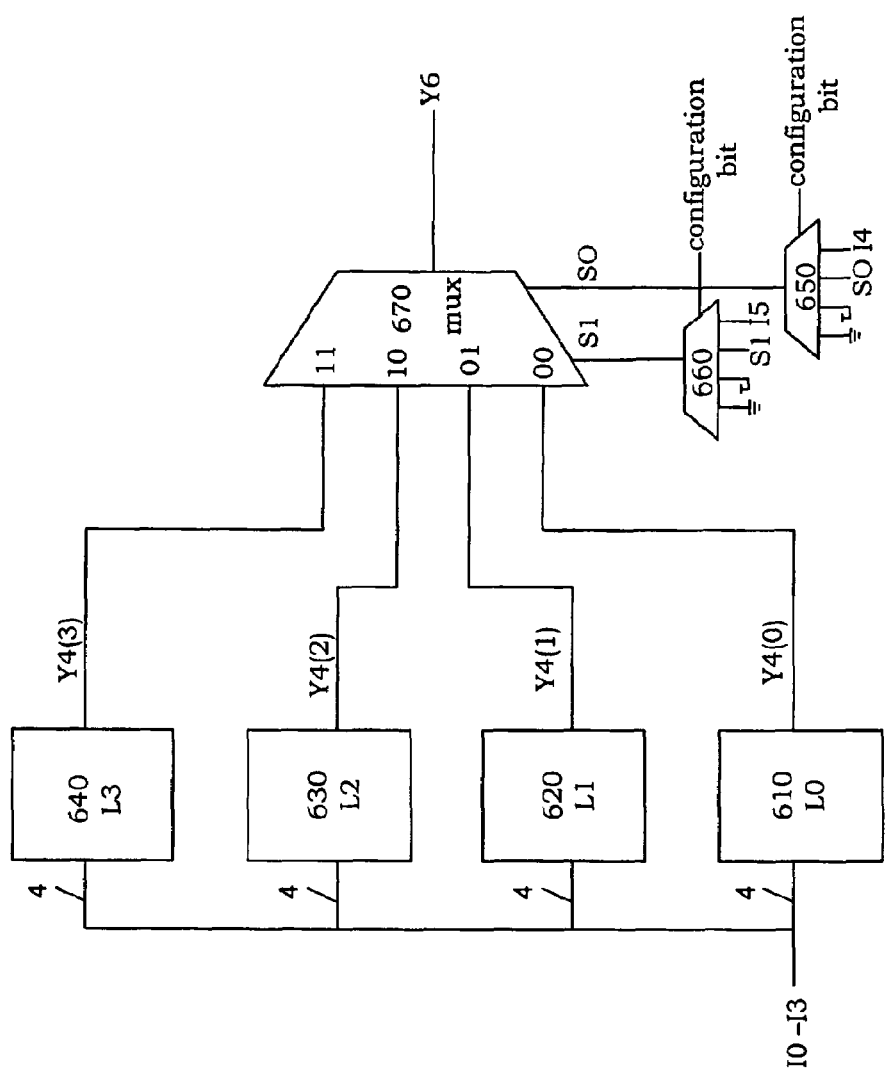
FIG. 6 is a logic diagram illustrating the configurable logic function (LL structure) in the dedicated logic cell in accordance with the present invention.

Turning now to FIG. 6, there is shown a logic diagram illustrating the configurable logic function (LL structure) circuit 522 in the dedicated logic cell 500. The configurable logic function circuit 522 is designed to perform one of the following functions: (1) a four 4-input look-up table, (2) a one 6-input look-up table, or (3) a 4-to-1 multiplexer. In the first function that operates as the 4 input look-up table, the dedicated logic cell 600 has four look-up tables, a first look-up table 610, a second look -up table 620, a third look-up table 630, and a fourth look-up table 640. Each of the first, second, third, and fourth look-up tables 610, 620, 630, and 640 has inputs for receiving four inputs of I0, I1, I2, and I3 to constitute a total of six inputs. In the second function that operates as one 6-input look-up table, a fifth input 14 from a multiplexer 650 and a sixth input I5 from a multiplexer 660 are added to the four inputs of I0, I1, I2, and I3. In the third function that operates as a 4-to-1 multiplexer, a multiplexer 670 receives a first input from an output Y4(0) of the first look-up table 610, a second input from an output Y4(1) of the second look-up table 620, a third input from an output Y4(2) of the third look-up table 630, and a fourth input from an output Y4(3) of the fourth look-up table 640. Two select lines of S0 and S1 in the multiplexer 670 select from among one of the four inputs, Y4(0), Y4(1), Y4(2), and Y4(3) to generate an output Y6.

Figure 7:
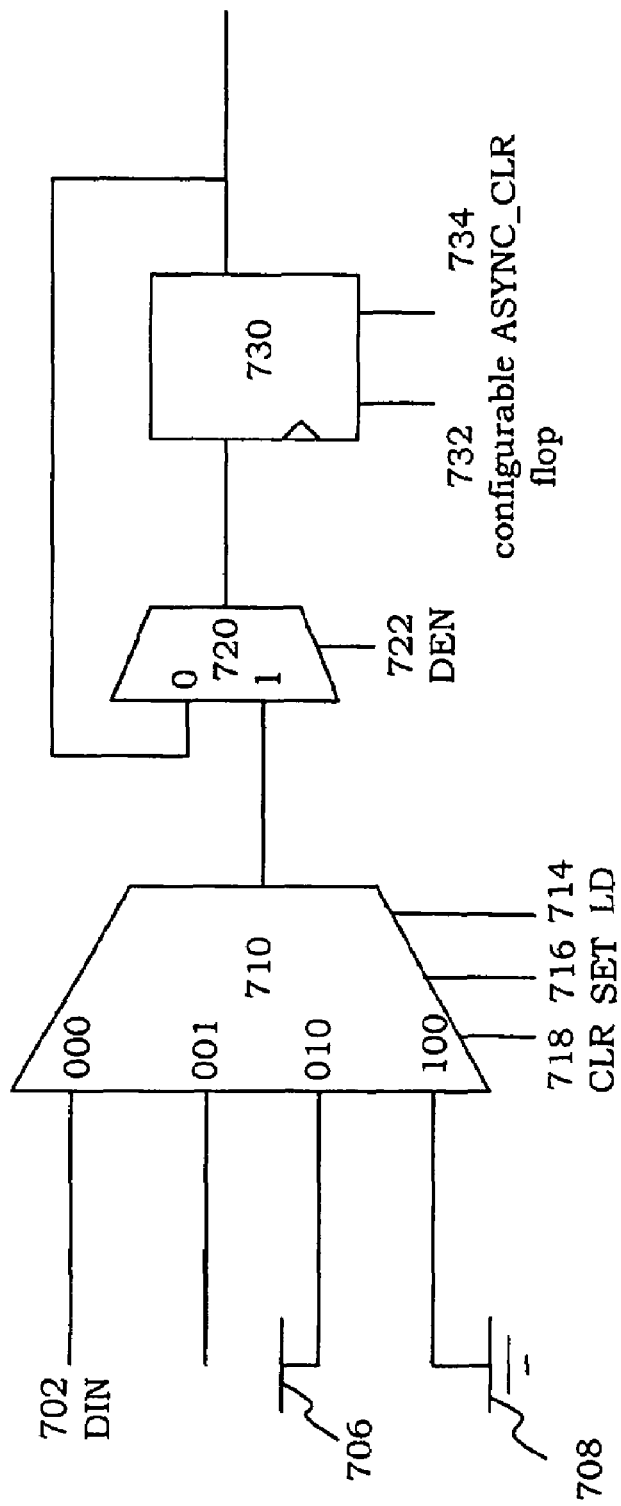

In FIG. 7, there is shown a logic diagram illustrating the sequential logic function circuit 526 (LS structure) in the dedicated logic cell 500. The sequential logic function circuit 526 comprises a 4-to-1 multiplexer 710, a 2-to-1 multiplexer 720, and a configurable flop 730. The 4-to-1 multiplexer 710 has a first input 000 connected a data input (DIN) 702, a second input 001 connected to a load data (LDDATA) 704, a third input connected to a Vcc 706, and a fourth input connected to a ground 708.

The dedicated logic cell 700 has four control signals, a loadable (LD) register signal 714, a synchronous clear signal (CLR) 716, a synchronous SET signal 718, and a data enable (DEN) 722. The configurable flop 730 can be configured to function either as a latch, a positive latch, a negative latch, a rising edge triggered flop, or a fallen edge triggered flop. As a whole, the sequential logic function circuit 526 provides the flexibility to build a register (i.e., configured as one of the logic circuits, as a latch, a positive latch, a negative latch, a rising edge triggered flop, or a fallen edge triggered flop) with any combination of the four control signals, the loadable register signal 714, the synchronous clear signal 716, the synchronous SET signal 718, and the data enable signal 722. For example, the sequential logic circuit 526 can be configured as a loadable rising edge triggered flop with an asynchronous clear signal.

Optionally, the four control signals, the loadable register signal 714, the synchronous clear signal 716, the synchronous SET signal 718, and the data enable 722 can be driven by dedicated lines.

FIG. 8 is shown a logic diagram illustrating the dedicated logic function circuit 524 (LD structure) in the dedicated logic cell 500. The dedicated logic function circuit 524 comprises a first multiplexer 810, a second multiplexer 820, and a third multiplexer 830. The first multiplexer 810 has a first input 812 encoded as 00 for receiving A signals, a second input 814 encoded as 01 for receiving a 6-input look-up table, a third input 816 encoded as 10 for receiving an arithmetic function, an adder function, or an accumulator function, and a fourth input 818 encoded as 11 for receiving a multiplication function. The second multiplexer 820 has a first input 822 encoded as 00 for receiving a 6-input look-up table, a second input 824 encoded as 01 for receiving B signals, a third input 826 encoded as 10 for receiving a 2-input look-up table 812 which further receives inputs of A signals and B signals, and a fourth input 828 encoded as 11 for receiving a shift data.

The third multiplexer 830 has a first input connected to an output of the first multiplexer 810, a second input connected to an output of the second multiplexer 820, and an output 836. A pair of multiplexer select lines, DLCOP1 842 and DLCOP2 844, is connected to both the first multiplexer 810 and the second multiplexer 820. In the first multiplexer 810, the DLCOP1 842 and the second DLCOP2 844 select between the first input 812, the second input 814, the third input 816, or the fourth input 818 for generating to the output 819. In the second multiplexer 820, the DLCOP1 842 and the second DLCOP2 844 selects between the first input 822, the second input 824, the third input 826, or the fourth input 828 for generating to the output 829. A multiplexer select line DLCOP0 840 is connected to the third multiplexer 830 for selecting between the first input 832 or the second input 834 for generating to the output 836.

The dedicated logic function circuit 800 is capable of selecting between different operations that are available which feed into the first multiplexer 810 and the second multiplexer 820. For example, the dedicated logic function circuit 800 can select to perform an adder function and a shift function. By selecting a desirable function, the dedicated logic function circuit 800 can be used to build an arithmetic unit.

Optionally, the three multiplexer select lines, the DLCOP0 840, the DLCOP1 842, and the DLCOP2 844, can be driven from dedicated lines. The DLCOP0 840, the DLCOP1 842, and the DLCOP2 844 can either be static or dynamically configurable, which configures the dedicated logic function circuit 800 into an arithmetic logic unit (ALU) functionality.

Turning now to FIG. 9, there is shown an alternative embodiment illustrating a logic diagram of a dedicated logic function circuit 900 that operates as a propagate/generate logic to perform the function of a took-ahead sum or as a priority multiplexer. The dedicated logic function circuit 900 has a first input for receiving A 902 from a configurable logic function (LL) and a second input for receiving B 904 from a configurable logic function (LL). Each of the incoming signals A 902 and B 904 is a 4-bit wide signal. The dedicated logic function circuit 900 comprises a configurable propagate function circuit 906, a configurable generate function circuit 908, and a look-ahead sum generator 950. The configurable propagate function circuit 906 has an OR gate 910, an inverter 930, and a multiplexer 940, while the configurable generate function circuit 908 has an AND gate 920. The input A 902 is fed into the OR gate 910 and the AND gate 920. The input B 902 is fed into the AND gate 920 and the inverter 930. The multiplexer 940 has a first input connected to an output of the OR gate 910 and a second input connected to an output of the inverter 930. A configurable bit (or select line), Arith or Priority Mux 942, selects between the first input or the second input of the multiplexer 940 and generates an output p[3:0] 944. The AND gate 920 generates an output, g[3:0] 922. The look-ahead sum generator 950 has a first input connected to the p[3:0] 944 output from the multiplexer 940, and a second input connected to the g[3:0] 922 output from the AND gate 920, with a carry-in signal 952 and a carry-out signal 954.

When the dedicated logic function circuit 900 operates as a sum circuit, the logic equation is represented as follows (not that the sum is generated from Cin):

$p = a \oplus b$ $g = a \cdot b$

When the dedicated logic function circuit 900 operates as a priority multiplexer, the logic equation is represented as follows (note that the carry-out is mux-out).

$p = \overline{a}$ $g = a \cdot b$

The equation for the configurable generate carry out is shown as follows: configurable generate carry out=g[3]+p[3] g[2]+p[3] g[2] g[1]+p[3] [g2] g[1] g[0]+p[3] p[2] p1] p[0] in Cin.

A sample priority multiplexer 1000 as described with respect to the dedicated logic function circuit 900 is shown in FIg. 10 for use in a carry-ahead generation scheme. The priority multiplexer 1000 comprises a first multiplexer 1010, a second multiplexer 1020, a third multiplexer 1030, and a fourth multiplexer 1040. A first select line S0 1016 in the first multiplexer 1010 selects between a first input 1012 or a second input IO 1014 for generating an output 1018. A second select line S1 1026 in the second multiplexer 1020 selects between a first input 1022 or a second input I1 1024 for generating an output 10-28. A third select line S2 1036 in the third multiplexer 1030 selects between a first input 1032 or a second input I2 1-34 for generating an output 1038. A fourth select line S3 1046 in the fourth multiplexer 1040 selects between a first input 1042 or a second input I3 1044 for generating an output 1048. As a command enters into the priority multiplexer 1000, the first select line S0 in the first multiplexer 1010 selects whether or not to execute the command. The remaining multiplexers 1020, 1030, and 1040 perform similar functions as the signal propagates through the priority multiplexer 1000. One application in the use of the priority multiplexer 1000 is for arbitration of multiple requests.

Turning now to FIG. 11, there is shown a state diagram 1100 illustrating a logic diagram of a control logic function circuit (LC structure) 534 in the dedicate logic cell 500. A control logic function 1110 obtains data-in from a lower control logic function (or a lower DLC) 1120 through dedicated lines 1125 and sends data-out to an upper control logic function (or an upper DLC) 1130. One functional objective of the control logic function circuit 534 is to minimize the delay from the lower LC 1120 to the upper LC 1130. To minimize the delay, the LC 1110 performs a carry look-ahead for various functions including arithmetic/priority multiplexer, a multiplexer and a 2-input function. Table 1 below provides a chart of DLC carry signals for the different logic operations.

| | DLC Carry Signals | | |
|---|---|---|---|
| Operation | Cout | Cin = 0 | Cin = 1 |
| Arith | g40: (40 & cin) | g40 | g40, p40 |
| AND | Y<0> & cin | 0 | Y |
| OR | Y<0> _ cin | Y | 1 |
| XOR | Y<0> ^ cin | Y | ~Y |
| MUX | mux_sel ? Cin mux_out | ~mux_sel & mux_out | mux_sel mux_out | where Y<4> represents the ZL<0> output of DLC1, and I<4> represents the input to DLC1.

The control logic function 1110 sends control signals 1165 to a sequential logic function 1160. In addition, the control logic function 1110 has a bi-directional communication, signal paths 1141 and 1142, with a dedicate logic function 1140. A set of dedicated lines are connected from the signal path 1141 to a dedicated logic function 1150, which in turn has a signal path 1151 to the control logic function 1110.

An example of a control logic function circuit 1200 is described in FIG. 12. In this example, there are four types of operations: an arithmetic operation—A, a multiplexer—M, a shift—S, and a look-up table—L. The control logic function circuit 1200 comprises a first multiplexer 1210, a second multiplexer 1220, and a third multiplexer 1230. The third multiplexer 1230 has a first input coupled to an output of the first multiplexer 1210 and a second input coupled to an output of the second multiplexer 1220, an output 1240, and a carry-select signal 1235. If the data-in from a lower LC to L(0) 1211 is 0 in the first multiplexer 1210, the result is pre-calculated, or if the data-in from the lower LC to L(1) 1221 is 1 in the second multiplexer 1220, the result is pre-calculated. If the data-in from a lower LC to S(0) 1212 is 0 in the first multiplexer 1210, the result is pre-calculated, or if the data-in from the lower LC to S(1) 1222 is 1 in the second multiplexer 1220, the result is pre-calculated. If the data-in from a lower LC to M(0) 1213 is 0 in the first multiplexer 1210, the result is pre-calculated, or if the data-in from the lower LC to M(1) 1223 is 1 in the second: multiplexer 1220, the result is pre-calculated. If the data-in from a lower LC to A(0) 1214 is 0 in the first multiplexer 1210, the result is pre-calculated, or if the data-in from the lower LC to A(1) 1224 is 1 in the second multiplexer 1220, the result is pre-calculated. The term to "pre-calculate the result" means to pre-calculate the result of what would be for data out, whether case if the data-in is either 0 or if the data-out is 1.

The LC 1110 sends signals through dedicated control lines 1145 to a dedicated logic cell 1140 and a dedicated logic cell 1150. The LC 1110 also sends controls 1165, such as data enable DEN, to a sequential logic cell 1160.

The collection of a configurable logic function (LL), a sequential logic function (LS), and a control logic function (LC) provides fundamental building blocks to design different programmable functionalities. Some of which are illustrated below.

Referring now to FIG. 13, there is shown a logic circuit illustrating one implementation of a dedicated logic cell 1300 implemented as a 4 2-input function employing configurable logic functions and dedicated logic functions. The dedicated logic cell 1300 is capable of performing a variety of function, including an AND function, an OR function, an XOR function, and any 2-input function. The dedicated logic cell 1300 comprises a first configurable logic function (LL) 1310 for receiving inputs IA<3:0>1302, a second configurable logic function (LL) 1320 for receiving inputs IB<3:0>1304, and a portion of a dedicated logic function (LD) 1330. The first configurable logic function 1310 has a first look-up table 1312, a second look-up table 1314, a third look-up table 1316, and a fourth look-up table 1318. The second configurable logic function 1320 has a first look-up table 1322, a second look-up table 1324, a third look-up table 1326, and a fourth look-up table 1328. The portion of a dedicated logic function (LD) 1330 comprises a first 2-input look-up table 1332, a second 2-input look-up table 1334, a third 2-input look-up table 1336, and a fourth 2-input look-up table 1338. The first 2-input look-up table 1332 has a first input connected to the first look-up table 1312 in the first configurable logic function 1310, a second input connected to the first look-up table 1322 in the second configurable logic function 1320, and generating an output Y<0> 1342. The third 2-input look-up table 1336 in the first configurable logic function 1310, a second input connected to the third look-up table 1326 in the second configurable logic function 1320, and generating an output Y<2> 1344. The fourth 2-input look-up table 1338 has a first input connected to the fourth look-up table 1328 in the first configurable logic function 1310, a second input connected to the third look-up table 1326 in the second configurable logic function 1320, and generating an output Y<3> 1346.

In FIG. 14, there is shown a logic circuit illustrating another implementation of a dedicated logic cell 1400 implemented as a 4 2:1 multiplexer employing configurable logic functions and dedicated logic functions. The dedicated logic cell 1400 comprises a first configurable logic function (LL) 1410 for receiving inputs IA<3:0> 1402, a second configurable logic function (LL) 1420 for receiving inputs IB<3:0> 1404, and a dedicated logic function (LD) 1430. The first configurable logic function 1410 has a first look-up table 1412, a second look-up table 1414, a third look-up table 1416, and a fourth look-up table 1418. The second configurable logic function 1420 has a first look-up table 1422, a second look-up table 1424, a third look-up table 1426, and a fourth look-up table 1428. The dedicated logic function 1430 comprises a first multiplexer 1432, a second multiplexer 1434, a third multiplexer 1436, and a fourth multiplexer 1438. The first 2:1 multiplexer 1432 has a first input connected to the first look-up table 1412 in the first configurable logic function 1410, a second input connected to the first look-up table 1422 in the second configurable logic function 1420, and generating an output Y<0> 1440, with a select line S0 1431 generated from a dedicated line. The second 2:1 multiplexer 1434 has a first input connected to the second look-up table 1424 in the first configurable logic function 1410, a second input connected to the second look-up table 1424 in the second configurable logic function 1420, and generating an output Y<0> 1442, with the select line S0 1431 generated from a dedicated line. The multiplexer 1436 has a first input connected to the third look-up table 1426 in the first configurable logic function 1410, a second input connected to the third look-up table 1426 in the second configurable logic function 1420, and generating an output Y<2> 1444, with the select line S0 1431 generated from a dedicated line. The fourth multiplexer 1438 has a first input connected to the fourth look-up table 1428 in the first configurable logic function 1410, a second input connected to the third look-up table 1426 in the second configurable logic function 1420, and generating an output Y<3> 1446, with the select line S0 1431 generated from a dedicated line.

FIG. 15 is a block diagram illustrating 2 6-input functions of configurable logic functions 1500 with separate inputs having a first configurable logic function 1510 and a second configurable logic function 1520. A first set of dedicated lines 1530 from a DLC below are routed to the first configurable logic function 1510 and the second configurable logic function 1520. The first configurable logic function 1510 receives inputs A 1505 while the second configurable logic function 1520 receives inputs B 1515.

In FIG. 16, there is shown a logic diagram illustrating a shift register 1600 which is capable to perform a loadable, resettable, or clearable function by using a combination of a configurable logic function 1610 and sequential logic functions 1620 and 1630. The configurable logic function 1610 has an input and an output, where the output of the configurable logic function 1610 is coupled to a first sequential logic circuit 1620 and a second sequential logic circuit 1630. The first sequential logic circuit 1620 generates a first register data output 1622, and the second sequential logic circuit 1630 generates a second register data output 1632.

FIG. 17 is a logic diagram illustrating an accumulator 1700 by employing configuration logic functions, a dedicate logic function, and sequential logic functions. The accumulator 1700 comprises a first configurable logic function 1710, a second configurable logic function 1720, a dedicated logic function 1730, a first sequential logic function 1740, and a second sequential logic function 1750. The first configurable logic function 1710 is coupled to a dedicated logic function 1730, which is in turn coupled to the first sequential logic function 1740 and the second sequential logic function 1750. The second configurable logic function 1720 is coupled to both the first sequential logic function 1740 and the second sequential logic function 1750.

FIG. 18 is a flow diagram 1800 illustrating a method for programming configuration bits for configuring one or more programmable function generators. At step 1810, a digital logic circuit is designed using Register Transfer Level (RTL) function description. At step 1820, the process 1800 synthesizes the circuit design to create a logical netlist. At step 1830, the process 1800 performs placement and route on the physical design of the logic circuit. At step 1840, the process 1800 programs or writes configuration bits into the configurable memory cells for selectors. At step 1850, the process 1800 writes into configurable memory cells in the programmable function generator for configuring memory cells to configure the programmable function generator as a combinational logic function generator, a sequential logic function generator, or a routing generator. At step 1860, the selector selects from one of its inputs depending on what has been written into the memory cells. At step 1870, the programmable function generator functions as a combinational logic function generator, a sequential logic function generator, or a routing function generator depending on the inputs from selector blocks as well as the global control signals.

A software program or computer-implemented-method may be used for generating values for a plurality of configuration memory bits or cells in a function generator; and responsive to the values in the plurality of configuration memory cells, generating any functionality for a combinational function, a sequential function (including flip-flops and latches) or a routing function. For example, a multiplexer output in a configurable propagate function circuit can be selected by a design software dependent on user application. In another example, first and second logic and routing cells are configured through the automatic software generation of configuration bits to produce a desirable dedicated logic cell structure. Furthermore, the combination of the first configurable logic function, the control logic function, the first sequential logic function, and the dedicated logic function can be configured automatically by software programming of configuration bits and can be detected from a user design Verilog file.

Those skilled in the art can now appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications, whether explicitly provided for by the specification or implied by the specification, will become apparent to the skilled practitioner upon a study of the drawings, specification, and following claims.

We claim:

1. A dedicated logic cell in a configurable logic function (LC), comprising:
    a first control logic function having a first input and a first output;
    a second (lower) control logic function having an input and an output, the output of the second control logic function coupled to the first input of the first control logic function through at least one dedicated line; and
    a third (upper) control logic function having an input and an output, the first output of the first control logic function coupled to the input of the third control logic function;
    where in the first control logic performs a carry look-ahead to reduce a signal delay from the second control logic function to the third control logic function.

2. The dedicated logic cell of claim 1, wherein the first control logic function further comprises a second output for generating one or more control signals to a sequential logic function.

3. The dedicated logic cell of claim 1, wherein the first control logic function comprises a third output that couples to an input in a dedicated logic function through one or more dedicated control lines.

4. The dedicated logic cell of claim 3, wherein the first control logic function further comprises a second input for coupling to an that couples to an output in the dedicated logic function.

5. The dedicated logic cell of claim 3, wherein the one or more dedicated control lines are unique within a logic and routing block.

6. The dedicated logic cell of claim 3, wherein the one or more dedicated control lines are shared among a plurality of logic and routing blocks.

7. A dedicated logic cell, comprising:
a logic and routing cell, comprising
a first configurable logic function (LL) having at least one input and at least one output;
a control logic function (LC) having at least one input and at least one output, the at least one input of the control logic function coupled to the at least one output of the first configurable logic function; and
a sequential logic function (LS) having at least one input and at least one output, the at least one input of the sequential logic function coupled to the at least one output of the control logic function;
wherein the configurable logic function comprising
a first control logic function having a first input, a first output and a second output for generating one or more control signals to the sequential logic function;
a second (lower) control logic function having an input and an output, the output of the second control logic function coupled to the first input of the first control logic function through at least one dedicated line; and
a third (upper) control logic function having an input and an output, the first output of the first control logic function coupled to the input of the third control logic function.

8. The dedicated logic cell of claim 7, wherein the first control logic function comprises a third output for coupling to an input of a dedicated logic function through one or more dedicated control lines.

9. The dedicated logic cell of claim 8, wherein the first control logic function comprises a second input for coupling to an output in the dedicated logic function.

10. The dedicated logic cell of claim 9, wherein the one or more dedicated control lines are unique within the logic and routing cell.

11. A dedicated logic cell, comprising:
a logic and routing cell, comprising
a configurable logic function (LL) having at least one input and at least one output;
a control logic function (LC) having at least one input and at least one output, the at l east one input of the control logic function coupled to the at least one output of the configurable logic function; and
a sequential logic function (LS) having at least one input and at least one output, the at least one input of the sequential logic function coupled to the at least one output of the control logic function;
wherein the configurable logic function comprising
a first control logic function having a first input, a first output, a second output, and a third output, the first control logic function generating one or more control signals at the second output to the sequential logic function, the first control, the third output of the first control logic function coupled to an input of a dedicated logic function through one or more dedicated control lines;
a second (lower) control logic function having an input and an output, the output of the second control logic function coupled to the first input of the first control logic function through at least one dedicated line; and
a third (upper) control logic function having an input and an output, the first output of the first control logic function coupled to the input of the third control logic function;
wherein the one or more dedicated control lines are shared among a plurality of logic and routing blocks.

12. A dedicated logic cell, comprising:
a first logic and routing cell, comprising
a first configurable logic function (LL) having at least one input and at least one output;
a control logic function (LC) having at least one input and at least one output, the at least one input of the control logic function coupled to the at least one output of the first configurable logic function; and
a first sequential logic function (LS) having at least one input and at least one output, the at least one input of the first sequential logic function coupled to the at least one output of the control logic function;
a second logic and routing cell, coupled to the first logic and routing cell, comprising
a second configurable logic function having at least one input and at least one output;
a dedicated logic function having at least one input and at least one output, the at least one input of the dedicated logic function coupled to the at least one output of the second configurable logic function; and
a second sequential logic function having at least one input and at least one output, the least one input of the second sequential logic function coupled to the at least one output of the control logic function;
wherein the second configurable logic function comprising:
a first control logic function having a first input and a first output;
a second (lower) control logic function having an input and an output, the output of the second control logic function coupled to the first input of the first control logic function through at least one dedicated line; and
a third (upper) control logic function having an input and an output, the first output of the first control logic function coupled to the input of the third control logic function.

13. The dedicated logic cell of claim 12, wherein the first control logic function further comprises a second output for generating one or more control signals to a sequential logic function.

14. The dedicated logic cell of claim 12, wherein the first control logic function comprises a third output for coupling to an input of the dedicated logic function through one or more dedicated control lines.

15. The dedicated logic cell of claim 14, wherein the first control logic function comprises a second input for coupling to an output in the dedicated logic function.

16. The dedicated logic cell of claim 14, wherein the one or more dedicated control lines are unique within the first logic and routing cell.

17. The dedicated logic cell of claim 14, wherein the one or more dedicated control lines are shared between the first logic and routing cell and the second logic and routing cell.

* * * * *